(12) United States Patent
Richardson

(10) Patent No.: US 6,396,332 B2
(45) Date of Patent: May 28, 2002

(54) SWITCHING ARRANGEMENTS

(75) Inventor: Robert Richardson, Chelmsford (GB)

(73) Assignee: Marconi Applied Technologies, Limited, London (GB)

(*) Notice: Subject to any disclaimer, the term of this patent is extended or adjusted under 35 U.S.C. 154(b) by 0 days.

(21) Appl. No.: 09/725,160

(22) Filed: Nov. 29, 2000

(30) Foreign Application Priority Data

Nov. 29, 1999 (GB) ............................................... 9928049

(51) Int. Cl.⁷ ............................................... H03K 17/16
(52) U.S. Cl. ....................................... 327/384; 327/396
(58) Field of Search ................................. 327/365, 373, 327/389, 391, 396, 399, 427, 382, 383, 384, 385; 361/15, 16, 17

(56) References Cited

U.S. PATENT DOCUMENTS 4,807,081 A * 2/1989 Crofts et al. .................. 361/56
5,155,352 A 10/1992 Kim et al. ................ 250/211 J
5,280,168 A * 1/1994 Kim et al. ................ 250/214.1
5,962,934 A * 10/1999 Fendt et al. ................. 307/126

* cited by examiner

Primary Examiner—My-Trang Nu Ton
(74) Attorney, Agent, or Firm—Venable; Robert Kinberg; Catherine M. Voorhees

(57) ABSTRACT

In a switching arrangement for applying a pulse to a load, for example a magnetron, a plurality of FET modules are stacked along the longitudinal axis and surrounded by a housing enclosing four capacitors. The capacitor means provides a current return path for current applied via the FET switches of the modules the coaxial current cancelling construction of the arrangement results in low circuiting conductance. The capacitance may be sufficiently large to provide electrostatic screening.

18 Claims, 1 Drawing Sheet

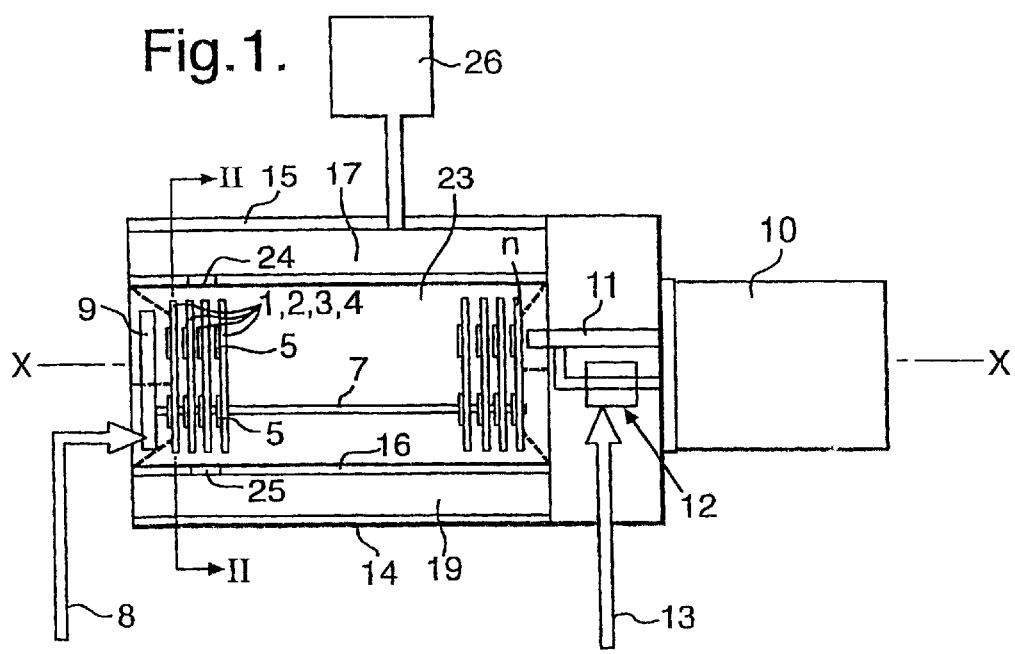
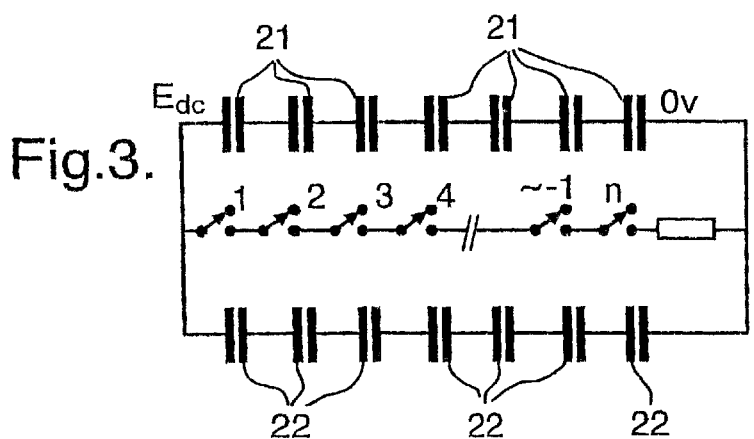
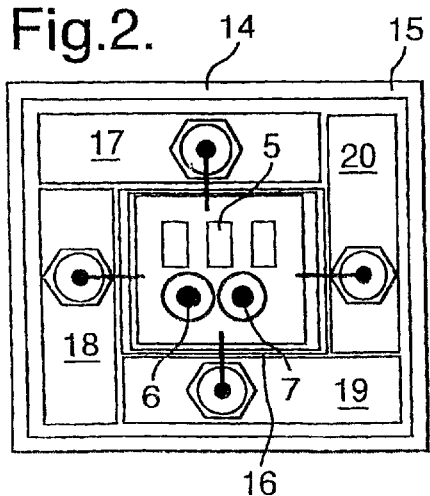
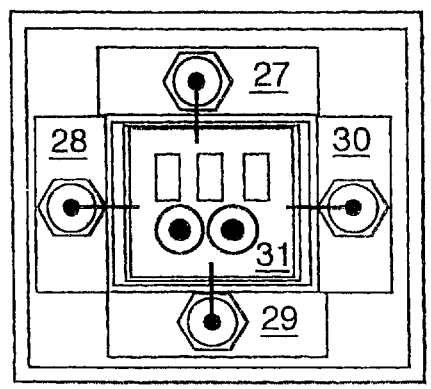

SWITCHING ARRANGEMENTS

FIELD OF THE INVENTION

This invention relates to a switching arrangement and more particularly, but not exclusively, to an arrangement employing a plurality of solid state switches.

BACKGROUND TO THE INVENTION

Previously, modulators used to drive rf devices, such as magnetrons, or for providing variable pulses for test equipment have used pulse transformers. More recently, we have previously proposed the use of a solid state switching arrangement in which a plurality of switch modules are connected together to give flexibility in operating voltage, duty cycle and pulse width with PRF's up to 750 kHz.

The present invention arose from consideration of the implementation of a solid state switching arrangement but it is envisaged that it will be applicable to other types of switching arrangements also.

SUMMARY OF THE INVENTION

According to the invention, a switching arrangement for applying a pulse to a load comprises: switching means and annular capacitor means surrounding and coaxial with the switching means, the capacitor means being electrically connected to provide a current return path for current applied via the switching means to the load.

The annular distribution of the capacitor means around the switching means to give a coaxial assembly results in a substantial and desirable reduction of circuit inductance because of the coaxial current cancelling construction, with current travelling in one direction through the switching means and in the opposite direction through the capacitor means. The low inductance improves switching performance compared to another arrangement in which a capacitor is located physically remote from the switching means.

Preferably, the energy stored in the capacitance of the capacitor means is sufficiently large compared to the energy of the pulse output applied to the load that the capacitor means acts as an electrostatic screen. The charge of the capacitor means does not deplete significantly during an output pulse applied to the load and there is virtually no voltage change across its terminals. Thus, pulse displacement currents on the outside of the capacitor means are minimized and hence it is possible to provide electrostatic shielding in a particularly low volume by the annular configuration of the capacitor. This significantly reduces interference to other equipment located in the vicinity of the switching arrangement.

Preferably the capacitor means is contained in a housing having an outer wall and an inner wall, and which defines a tank in which the switching means is located. That is, the switching means is located within the volume bounded by the inner wall. A dielectric fluid may be contained within the tank, in the volume surrounded by the inner wall of the housing. The dielectric fluid may provide electrical insulation around the switching arrangement to prevent electrical breakdown. Alternatively, or in addition, the dielectric fluid may provide cooling for the switching means. In a preferred embodiment, the dielectric fluid is oil but other fluids may be suitable, for example, air cooling may be used.

The invention is particularly applicable where the switching means is solid state switching means. In one preferred embodiment, the solid state switching means includes a power FET. In alternative embodiment it could include an IGBT. The invention may be applied to a switching arrangement having a single solid state switch but is particularly advantageous where the switching means comprises a plurality of switches. These may be carried by a plurality of stacked modules with the switches being connected in series or in parallel. However, a single switch of any alternative technology may also be employed in the invention, such as a high power vacuum tube having a controllable input.

Where a plurality of stacked switching modules are used, it enables high voltage output pulses to be achieved, for example, of the order of tens of kilovolts, the number of modules may be of the order of 60 or more.

Preferably, the annular capacitor means comprises a plurality of capacitors distributed coaxially about the switch means. However, it could be embodied as a single annular capacitor in some arrangements. In one convenient arrangement, the annular capacitor means has a rectangular transverse cross-section, but other configurations could be used, for example, the annular capacitor could have a circular transverse cross-section.

Preferably, where the capacitor means comprises a plurality of capacitors, each capacitor comprises a plurality of capacitor elements connected in series. Thus, the capacitor elements are arranged along the longitudinal length of the switching means in a direction parallel to the current flow through the switching means. Preferably, the capacitor elements are arranged such that there is a nominally linear voltage gradient from one end of the capacitor means to the other. Thus, dc and low frequency electric field appear across the length of the device whilst pulse stress appears transversely to this across the smaller coaxial structure in a radial direction.

Where the capacitor means is fluid filled, then the housing of the capacitor means may communicate with the interior volume within which the switching means is located so that mixing occurs between the fluid in the capacitor volume and fluid in the switching means region where identical or compatible dielectric fluids are used. A fluid expansion system located separately from the capacitor means housing may be included to allow for expansion of fluid within the capacitor means.

In a preferred arrangement where the load includes a vacuum tube, for example, a magnetron, or some other device using a thermionic cathode, a heater supply is located at the pulse output end of the switching means.

An advantage of an arrangement in accordance with the invention is that impedance matching is not a design requirement or limitation.

A trigger circuit for the switching means may be included at the high voltage end of the switching means remote from the load to minimize displacement capacitance which occurs when the switching means is operated.

BRIEF DESCRIPTION OF THE DRAWINGS

Some ways in which the invention may be performed are now described by way of example with reference to the accompanying drawings in which:

FIG. 1 is a schematic longitudinal view of a switching arrangement in accordance with the invention;

FIG. 2 is a schematic cross-sectional view along the line II—II of FIG. 1;

FIG. 3 is a schematic circuit diagram of the arrangement shown in FIG. 1; and

FIG. 4 shows an alternative arrangement in transverse view.

DESCRIPTION OF PREFERRED EMBODIMENTS

With reference to FIGS. 1 and 2, a switching arrangement includes switching means comprising a plurality of FET modules 1, 2, 3, 4 ... n which are stacked along a longitudinal axis X—X. The modules 1, 2 ... n are nominally identical and in this arrangement there are 64 of them. Each module carries an FET switch 5 and a secondary winding 6 of a transformer. The primary winding 7 of the transformer is common to all FET modules, interconnecting them and is used to supply power to the FET switches. Power into the switching arrangement is applied at 8 via a trigger driver 9 located at the high voltage end of the switching arrangement which is maintained at −55 kV. The load 10, which in this case is a magnetron, is connected to the output 11 of the switching arrangement to receive the pulses which are output from the switching means. Power is applied to a heater transformer 12 via line 13 for connection to the magnetron 10.

The FET modules 1,2,3 ... n are surrounded by a housing 14 of a plastics material which has an outer wall 15 and an inner wall 16, the housing being annular and rectangular in transverse section. Four capacitors 17, 18, 19 and 20 are arranged within the housing 14 around the periphery of the switching means, each capacitor being connected at the high voltage end to the first switch module and at the low voltage end, in this embodiment at ground, to the load 10. Each capacitor 17 to 20 comprises a plurality of rectangular plates forming capacitor elements 21, 22 shown in FIG. 3, which are interconnected such that a nominally linear voltage gradient appears from the power supply end to the zero volt end. In this embodiment, the capacitors are each 0.15 micro Farads.

The interior volume 23 defined by the housing 14 which contains the FET modules 1, 2 ... n is filled with oil for voltage insulation and cooling. Similarly, in this arrangement, the capacitors 17 to 20 are also oil filled. Openings 24 and 25 are included between the interior 23 defined by the housing 14 and the capacitor region to allow fluid communication between them. A conduit connects with a separate reservoir 26 to allow for expansion of fluid within the capacitors.

The axial length of the stack and the surrounding capacitors is approximately 1 meter and the outer diameter is approximately 40 cms.

In operation, power is supplied to the modules via the primary winding 7 and on application of a trigger signal, the FET switches are closed. A drive pulse is applied to the load 10 current travels in opposite directions through the load 10 switching means and the capacitors 17,18, 19 and 20 to give current cancelling. The bulk of the capacitors acts to provide electrostatic shielding.

FIG. 4 shows a slightly different arrangement of capacitors 27 to 30 around FET modules 31. In an alternative embodiment not shown, a single elongate capacitor is included located around the switching modules.

I claim:

1. A switching arrangement for applying a pulse across a load comprising: switching means for applying current to the load; and annular capacitor means for creating a current return path, said capacitor means surrounding and coaxial with the switching means, the capacitor means being electrically connected to provide the current return path for current applied via the switching means to the load.

2. An arrangement as claimed in claim 1 wherein the switching means is solid state.

3. An arrangement as claimed in claim 2 wherein the switching means comprises at least one power FET.

4. An arrangement as claimed in claim 1 wherein the switching means comprises a plurality of switches carried by a plurality of stacked modules.

5. An arrangement as claimed in claim 1 wherein the annular capacitor means comprises a plurality of capacitors distributed coaxially about the switching means.

6. An arrangement as claimed in claim 5, wherein the annular capacitor means includes four capacitors distributed orthogonal to one another.

7. An arrangement as claimed in claim 1, wherein the capacitor means includes a plurality of capacitor elements connected in series.

8. An arrangement as claimed in claim 7, wherein the annular capacitor means includes four capacitors distributed orthogonal to one another.

9. An arrangement as claimed in claim 1 wherein the capacitor means is fluid filled.

10. An arrangement as claimed in claim 1 wherein the capacitor means is contained in a housing having an outer wall and an inner wall, and the switch means is located within the volume interior to the inner wall.

11. An arrangement as claimed in claim 10 wherein the housing is of a plastics material.

12. An arrangement as claimed in claim 10 wherein the housing has a rectangular cross-section configuration.

13. An arrangement as claimed in claim 1 and including dielectric fluid in which the switching means is immersed.

14. An arrangement as claimed in claim 1 wherein there is fluid communication between the volume where the switching means is located and the volume where the capacitor means is located.

15. An arrangement as claimed in claim 1, further including a trigger driver located at a high voltage end of the switching means.

16. An arrangement as claimed in claim 1, further including a heater transformer for the load located at a grounded end of the switching means.

17. An arrangement as claimed in claim 1 wherein the load is a rf device or system.

18. A switching arrangement for applying a pulse across a load comprising:

switching means and annular capacitor means surrounding and coaxial with the switching means, the capacitor means being electrically connected to provide a current return path for current applied via the switching means to the load; wherein the switching means comprises a plurality of solid state switches carried by a plurality of stacked modules and the annular capacitor means includes a plurality of capacitor elements connected in series.

* * * * *